United States Patent [19]

Nishi et al.

[11] Patent Number: 5,131,799
[45] Date of Patent: Jul. 21, 1992

[54] SEMICONDUCTOR WAFER TRANSFERRING APPARATUS AND BOAT FOR THERMAL TREATMENT OF A SEMICONDUCTOR WAFER

[75] Inventors: Hironobu Nishi; Kenichi Yamaga, both of Sagamihara; Takanobu Asano, Yokohama, all of Japan

[73] Assignee: Tel Sagami Limited, Kanagawa, Japan

[21] Appl. No.: 617,872

[22] Filed: Nov. 26, 1990

Related U.S. Application Data

[62] Division of Ser. No. 266,651, Nov. 3, 1988, Pat. No. 5,030,057.

[30] Foreign Application Priority Data

| Nov. 6, 1987 | [JP] | Japan | 62-280561 |
| Nov. 11, 1987 | [JP] | Japan | 62-285079 |
| Nov. 11, 1987 | [JP] | Japan | 62-285080 |

[51] Int. Cl.⁵ .................................. B65G 1/04
[52] U.S. Cl. .................................. 414/416; 414/225
[58] Field of Search .......... 414/404, 416, 417, 786, 414/331, 403, 222, 225, 226, 754, 757, 749, 750, 273; 118/500, 728, 729; 198/345, 340; 294/87.1; 901/46, 47

[56] References Cited

U.S. PATENT DOCUMENTS

| 3,998,333 | 12/1976 | Kamada | 118/500 X |
| 4,449,885 | 5/1984 | Hertel et al. | 198/345 X |
| 4,466,766 | 8/1984 | Geren et al. | 414/750 X |
| 4,568,234 | 2/1986 | Lee et al. | 414/404 |
| 4,687,091 | 8/1987 | Sticht | 198/345 |
| 4,757,890 | 7/1988 | Motoda | 198/345 |
| 4,782,760 | 11/1988 | Rohrbach et al. | 414/750 X |

FOREIGN PATENT DOCUMENTS

| 8714 | 3/1980 | European Pat. Off. | 414/754 |
| 60-24034 | 2/1985 | Japan . |
| 60-201641 | 10/1985 | Japan . |

Primary Examiner—Frank E. Werner
Attorney, Agent, or Firm—Oblon, Spivak, McClelland, Maier & Neustadt

[57] ABSTRACT

A wafer transferring method for transferring wafers between a cassette and a boat having grooves to hold the wafers, comprises the steps of providing an identification mechanism for positional alignment on the boat in advance, detecting the identification mechanism, and aligning the boat to a predetermined position based on a detection result and transferring the wafers from the cassette to the boat. A wafer transferring apparatus comprises a loading device for extracting wafers from a cassette and transferring the wafers onto a boat, a detection device for detecting an identification section provided on the boat in order to identify a wafer transferring position on the boat, a control device for acquiring the wafer transferring position on the boat based on a detection result attained from the detection device and controlling a mutual position between the boat and the cassette to come to a predetermined position.

7 Claims, 13 Drawing Sheets

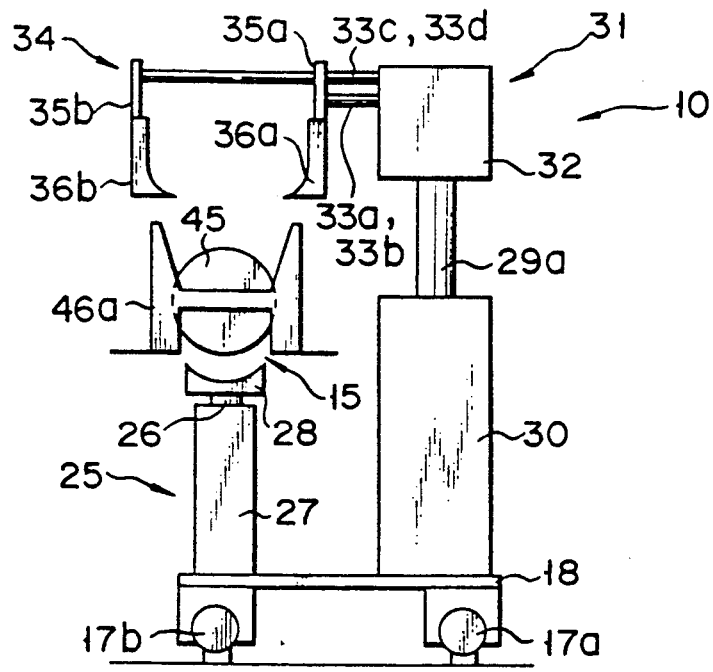
F I G. 7
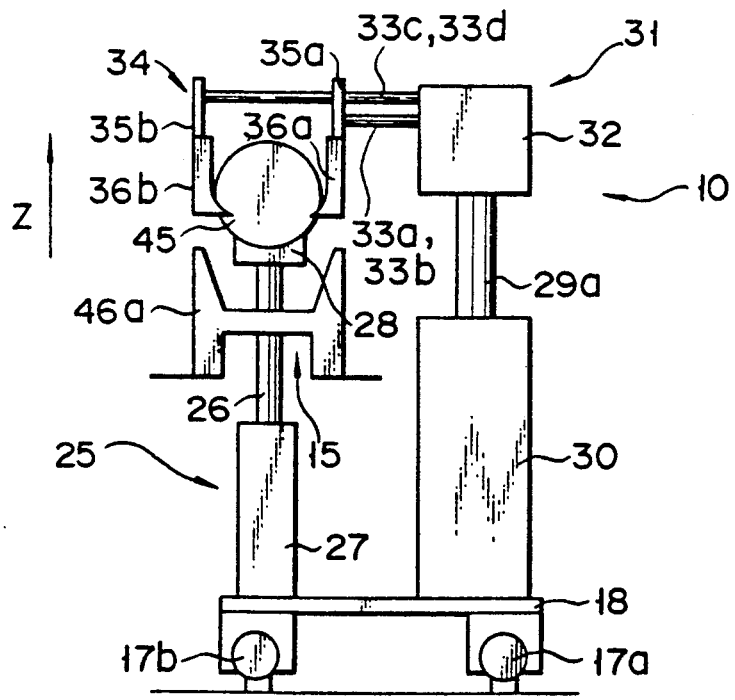
F I G. 8

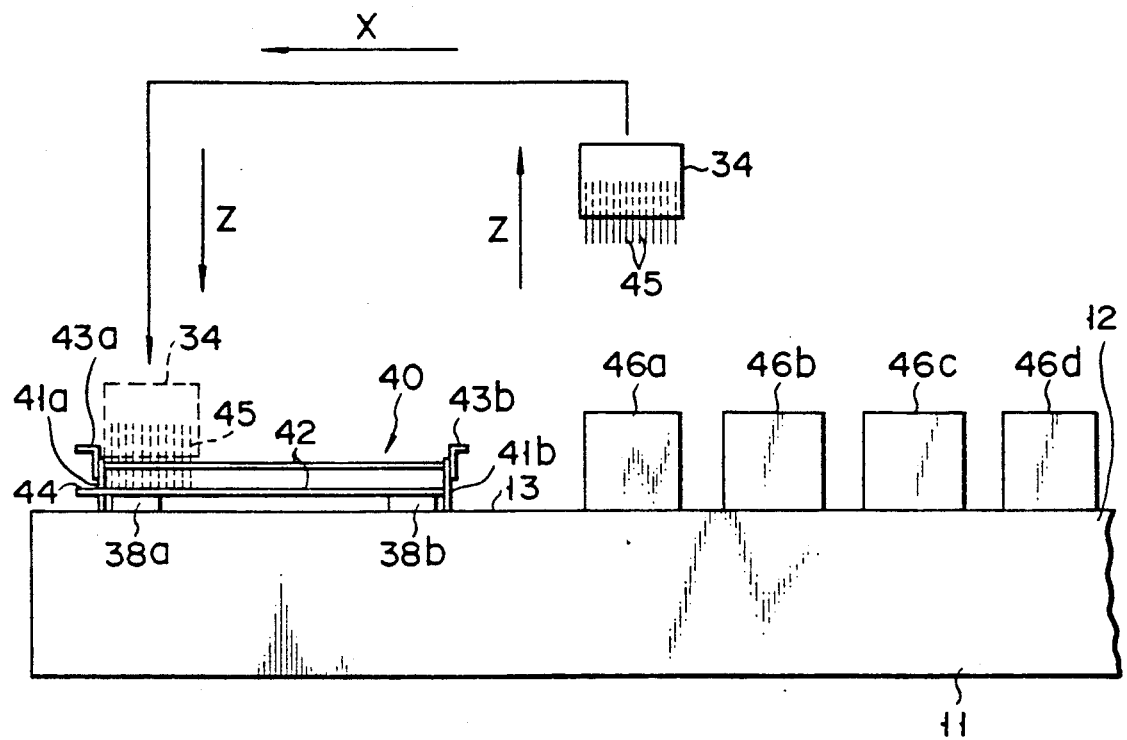
F I G. 9
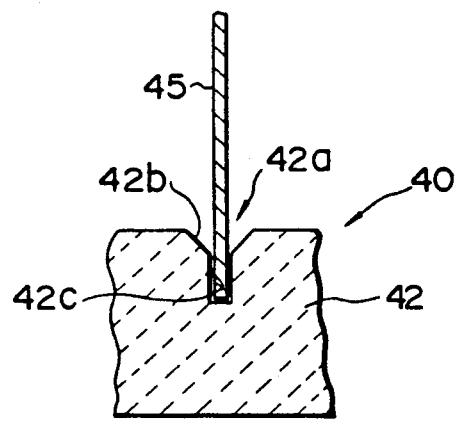
F I G. 10

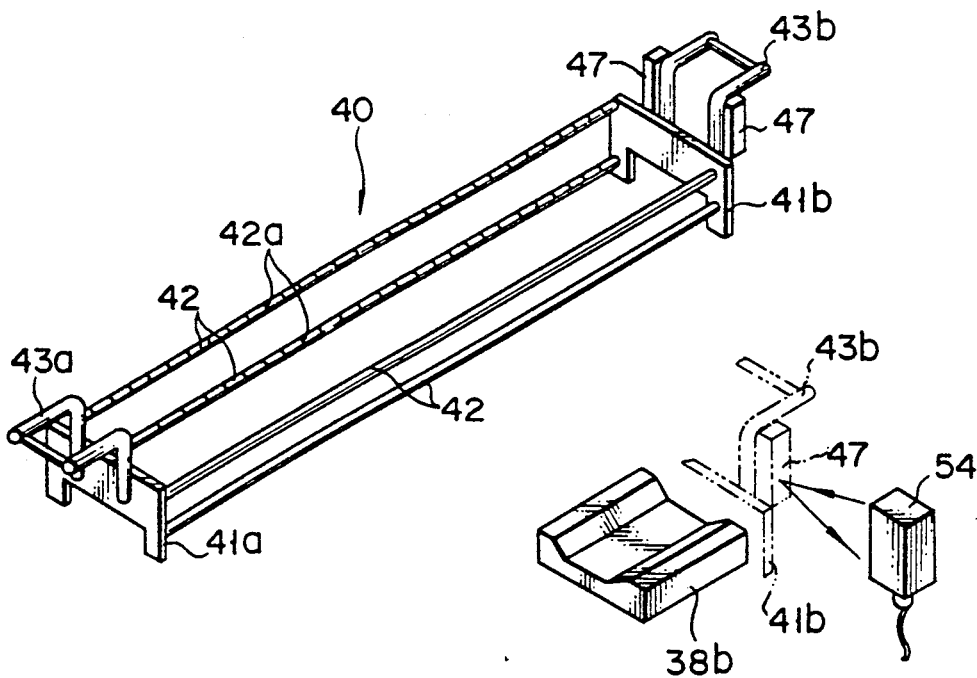
F I G. 11
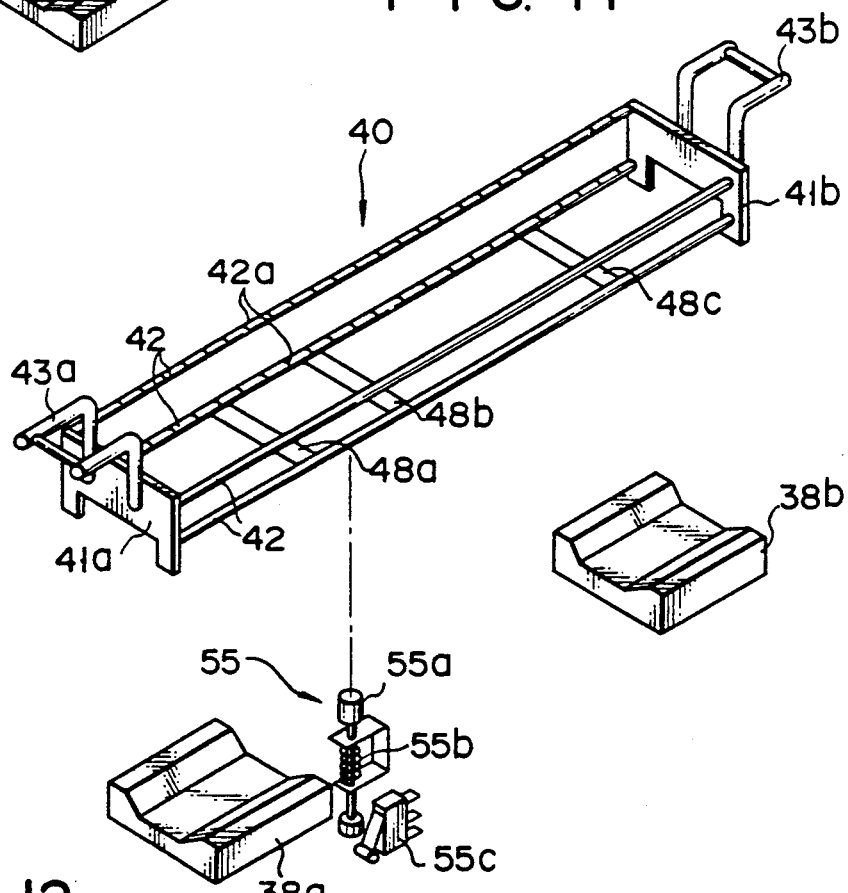
F I G. 12

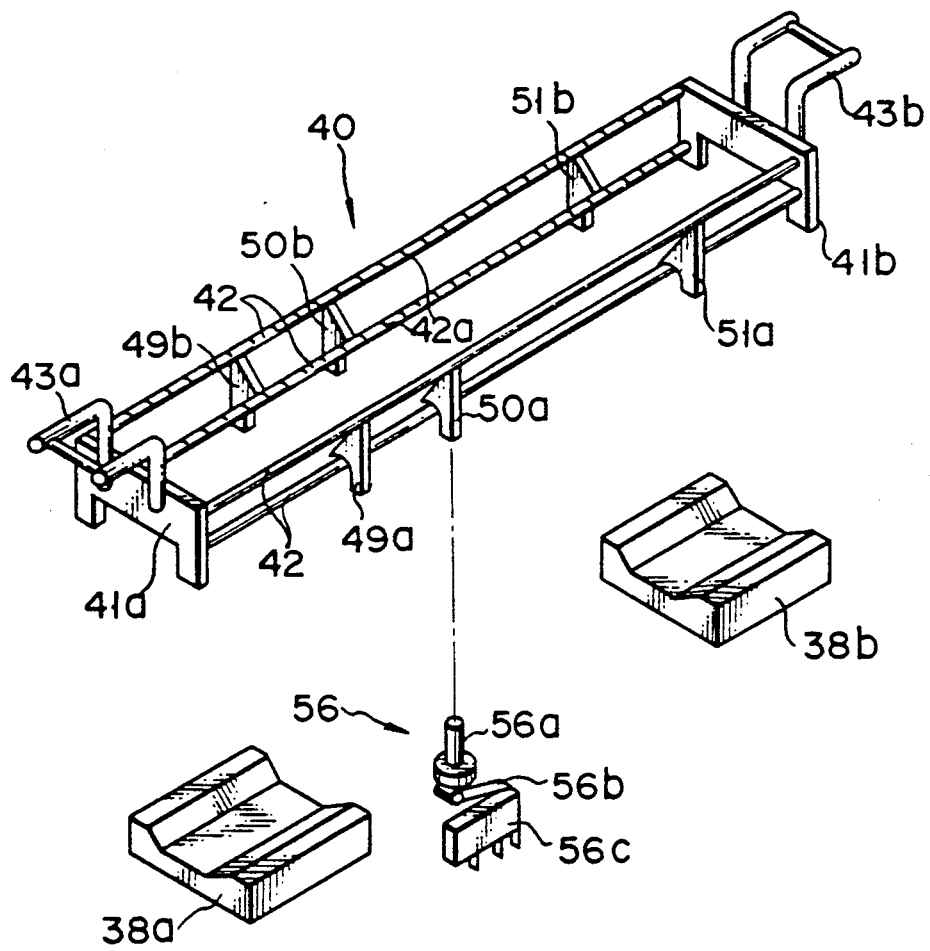
F I G. 13

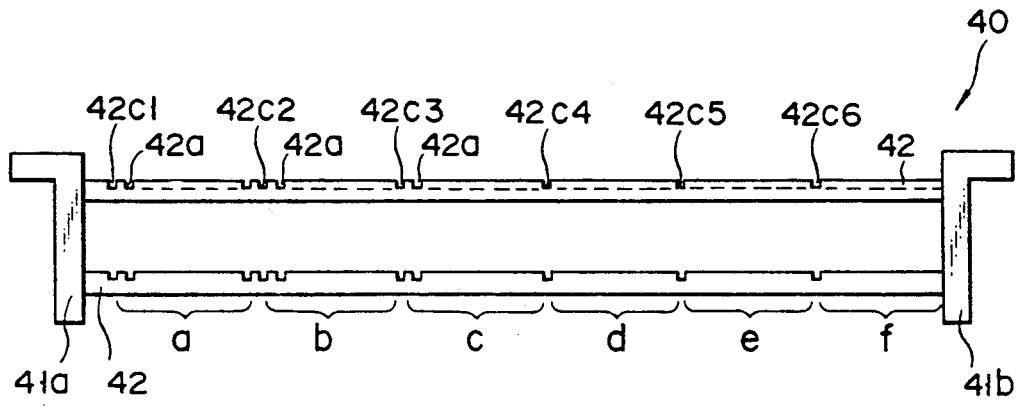
F I G. 15
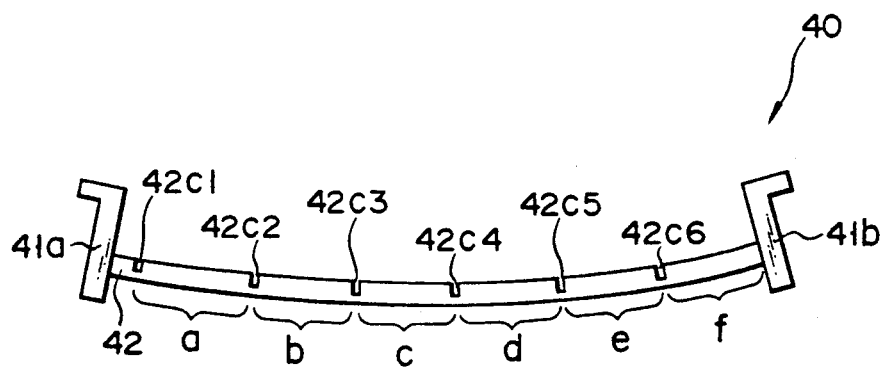
F I G. 16

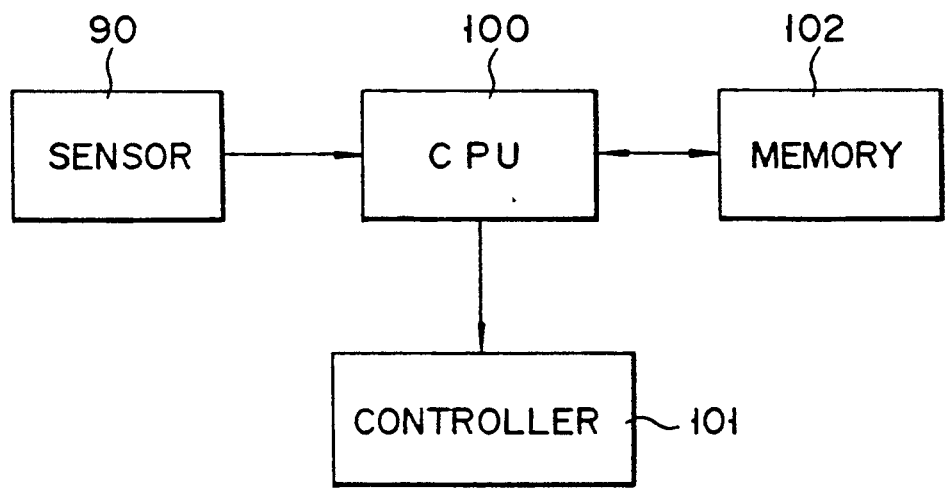
F I G. 19

SEMICONDUCTOR WAFER TRANSFERRING APPARATUS AND BOAT FOR THERMAL TREATMENT OF A SEMICONDUCTOR WAFER

This is a division of application Ser. No. 07/266,651, filed on Nov. 3, 1988, now U.S. Pat. No. 5,030,057.

BACKGROUND OF THE INVENTION

1. Field of the Invention

The present invention relates to a method and an apparatus for transferring a semiconductor wafer to a cassette from a boat in front of the inlet of a furnace, and also relates to a boat which is sent in, and out from, the furnace while carrying a number of stacked semiconductor wafers.

2. Description of the Related Art

A semiconductor device, such as an IC or LSI, is produced by sequentially subjecting a wafer cut out from an ingot to various processes, such as a surface treatment, thermal oxidation, impurity diffusion, film deposition and etching. During these processes, the semiconductor wafer repeatedly undergoes heat treatment several times.

In general, a multistage furnace, e.g., a four-stage furnace, which is furnaces vertically stacked, is used as a heating furnace for heat treatment for semiconductor wafers. A multi-shelf unit is disposed in front of the furnace inlet, and various automatic units for treating semiconductor wafers are mounted to this unit.

An exclusive wafer boat is used in sending semiconductor wafers in, and out from, the furnace. One boat generally carries a stack of 200 wafers at a maximum per lot.

An exclusive cassette (wafer-carrier) is used to convey semiconductor wafers to a furnace from the position at which the previous process has been effected. One cassette generally carries 25 wafers at a maximum per lot. Accordingly, it is necessary to transfer wafers from a plurality of cassettes onto one boat.

In dealing with wafers, an operator is inhibited from directly touching the wafers with his hands for decontamination. Therefore, an exclusive wafer transferring apparatus is disposed at the proximity of the furnace inlet as an installation of the furnace in order to automatically transfer wafers to the boat from the cassettes.

The wafer transferring apparatus comprises a first stage (carrier stage) on which a cassette is disposed, a second stage (boat stage) on which a boat is disposed, and a loading device for transferring wafers to the second stage from the first one and loading the wafers onto the boat. The loading device includes a pushing mechanism for pushing up the wafer in the cassette and a chuck mechanism for holding and releasing the wafers.

In transferring wafers from a cassette to a boat by means of the transferring apparatus, a plurality of cassettes each carrying wafers are aligned on the first stage, the wafers in the first cassette are lifted above the cassette by the pushing mechanism, these wafers are held and conveyed over the boat on the second stage by the chuck mechanism, and they are then disposed on the boat by releasing the chuck. Substantially the same operation is repeated for the second to sixth cassettes to sequentially transfer the wafers in these cassettes onto the boat to fill it up.

Then, the boat is lifted, by an elevator device, onto the multi-shelf unit in front of the furnace inlet and is inserted in the furnace by the soft landing device. The operation sequence is executed by the transferring device under the control of a computer based on a preset program.

As shown in FIG. 1, conventional boat 1 includes a pair of end plates 1a and 1b, four parallel support rods 2a to 2d supported by the end plates 1a and 1b, and handles 3a and 3b. Each support rod 2a, 2b, 2c or 2d has a number of grooves 4 formed therein at equal intervals to hold wafers, so that boat 1 has a substantially symmetric outline with respect to its length.

The mutual intervals between grooves 4 for holding wafers are the same as those of the grooves formed in the internal wall of each cassette. The surface for holding wafers of the loading device also has grooves at substantially the same intervals as grooves 4.

According to the conventional wafer transferring method, wafers are sequentially placed on boat 1 from the side of one end plate 1a toward the other end plate 1b. In general, all the wafers in each cassette are transferred onto the boat together.

Boat 1 is made of a refractory material, such as quartz-glass or SiC and generally has a low size accuracy. Since grooves 4 of the boat are sequentially formed, with one end plate 1a as a reference, toward the other end plate 1b, the distance $L_1$ from one end plate 1a to the adjoining groove 4 differs from the distance $L_2$ from the other end plate 1b to its adjoining groove 4. That is, strictly speaking, boat 1 is asymmetrical with respect to its length.

Assuming wafers are sequentially transferred onto boat 1 from the side of end plate 1a, therefore, an operator measures the distance $L_1$ specific to each boat and remembers it prior to wafer transfer. And, for each wafer transfer operation, the operator should input the specific value $L_1$ to a boat to be used, to a computer and then place the boat on the second stage.

That is, the computer programming for controlling the operation of the transferring device is set with the position of one end plate 1a as the reference.

As many boats are frequently put in and out from the furnace, it is likely that the operator will put boats in a wrong direction or in a wrong order.

In the case where a boat is put on the second stage with the wrong side on front, if wafers are sequentially disposed on the boat from the side of the other end plate 1b according to the mentioned programming, there may occur a mismatch between the positions of the wafers grabbed by the chuck and the positions of grooves 4 of the boat When the mismatch occurs, the edge portions of the wafers rub against the peripheries of grooves 4 so as to generate quartz-glass powder, thus contaminating the clean room. If the peripheries of grooves 4 are scraped to thereby reduce the accuracy of the grooves, the boat may not be used any more. That is, the life of the boat is shortened.

When the mismatch between the wafers and grooves 4 is prominent, the wafers will not be fitted in their associated grooves 4, damaging the wafers and reducing the yield of the final products.

Further, in a case where an operator will put boats in a wrong order, with a single wafer transferring apparatus shared by four furnaces (a four-stage furnace), there may be a difference between data input to a computer and the actual distance $L_1$ of the boat, thus causing a mismatch between the wafers and grooves 4.

Further, it is probable that the boat expected to be inserted into the first-stage furnace is actually put in the second-stage furnace With the prior art, it is difficult to visually identify boats and the reference side of each boat for wafer transfer, so that an identification mark is put on each boat. However, since the boat is heated at a high temperature in the furnace and is subjected to etching in order to remove the impurities adhered to the boat, the identification mark is likely to become unidentifiable.

Since a boat is deformed by heat, the reference distance $L_1$ initially set varies. In this respect, it is necessary to measure the reference distance $L_1$ and input this measurement to a computer every time a boat is inserted in the furnace.

In addition, the intervals between the grooves for receiving wafers also vary due to thermal deformation of the boat, so that if wafers are sequentially transferred on the boat from one end thereof, the deviation between the wafers and grooves is accumulated, thus eventually causing a mismatch therebetween.

SUMMARY OF THE INVENTION

Accordingly, it is an object of this invention to provide a wafer transferring method and apparatus which can objectively identify the reference wafer transferring side of a boat and can set the boat in the correct direction, irrespective of an operator's memory.

It is another object of this invention to provide a wafer transferring method and apparatus which can identify one boat from another, irrespective of an operator's memory.

It is a still another object of this invention to provide a wafer transferring method and apparatus which can compensate the transferring position every time wafers for one lot of carriers are transferred and can prevent a mismatch between wafers and grooves for receiving the wafers.

It is a further object of this invention to provide a boat for use in heat treatment of wafers, which can be individually identified from another boat and whose wafer transferring reference side can be identified, irrespective of an operator's memory.

According to one aspect of this invention, there is provided a wafer transferring method for transferring wafers between a cassette and a boat having grooves to hold the wafers, which method comprising the steps of:
  providing identification means for positional alignment on the boat;
  detecting the identification means; and
  aligning the boat to a predetermined position based on a detection result and transferring the wafers from the cassette to the boat.

In this case, the identification means is an asymmetrical member, for example, a reinforcing member or a support leg, asymmetrically attached to the boat, and it is detected whether or not the asymmetrical member exists. From the detection result, it is discriminated whether or not the boat is set in a correct direction, and it is desirable that the wafers be unloaded from the cassette to the boat.

A second groove different from grooves for holding the wafers may be formed as the identification means in the boat, and this groove may be detected by a photosensor. In this case, it is desirable that the second groove be detected while moving the boat.

Further, a plurality of holes may be formed in at least one of end plates of the boat, pins may be fitted in these holes according to a given rule and each boat may be identified by a combination of the fitted pins. In this case, it is desirable that the pins be colored differently to ensure visual discrimination.

According to another aspect of this invention, there is provided a wafer transferring apparatus comprising:
  loading means for extracting wafers from a cassette and transferring the wafers onto a boat;
  detection means for detecting an identification section provided on the boat in order to identify a wafer transferring position on the boat; and
  control means for acquiring the wafer transferring position on the boat based on a detection result attained from the detection means and controlling a mutual position between the boat and the cassette to come to a predetermined position.

In this case, it is desirable that the loading means have a pushing mechanism for pushing the wafers above the cassette, a chuck mechanism for holding and releasing the pushed wafers and an X-axis drive mechanism for moving the chuck mechanism in an X-axis direction (a lengthwise direction) of the boat.

In addition, it is desirable that the control means be a computer system that has a keyboard through which boat data is manually entered.

Further, it is desirable that a first stage on which the cassette is disposed and the second stage be aligned in a line in the X-axis direction of the boat.

Furthermore, it is desirable that the second stage have a depression member at a position where the boat is disposed, so that this depression member is pushed down when the boat is disposed on the second stage.

According to a further aspect of this invention, there is provided a boat for use in a heat treatment of wafers, which comprises:
  rod members each having a number of grooves formed therein to hold the wafers;
  a pair of end plates for supporting the rod member at both ends thereof; and
  an identification member, provided at one of the end plates or one of the rod members, for determining a reference position where the wafers are to be loaded.

In this case, a plate member serving as the identification member may be attached to one of the end plates, or a asymmetrical reinforcing rod may be bridged over the rod members.

A plurality of pins serving as the identification member may be formed on one of the end plates, so that individual boats can be identified by changing a combination of the pins boat by boat.

It is desirable that the individual sections of the boat be made of quartz-glass or SiC.

BRIEF DESCRIPTION OF THE DRAWINGS

FIGS. 7 and 8 are side views exemplarily illustrating a loading device;

FIG. 9 is a front view exemplarily illustrating a transferring apparatus for explaining how to transfer wafers from a cassette to a boat using the wafer transporting apparatus according to the first embodiment;

FIG. 10 is a lateral cross-sectional view illustrating a wafer being fitted in a groove formed in a boat;

FIG. 11 is a perspective view illustrating parts of a boat and a wafer transferring apparatus according to the second embodiment;

FIG. 12 is a perspective view illustrating parts of a boat and a wafer transferring apparatus according to the third embodiment;

FIG. 13 is a perspective view illustrating parts of a boat and a wafer transferring apparatus according to the fourth embodiment;

FIG. 15 is a front view of a modification of the fifth embodiment, which exemplarily illustrates a boat having its monitoring groove altered;

FIG. 16 is a front view exemplarily illustrating a thermally-deformed boat;

FIG. 19 is a schematic block diagram of a control system of a wafer transferring apparatus according to the sixth embodiment.

DETAILED DESCRIPTION OF THE PREFERRED EMBODIMENT

Preferred embodiments of this invention will be described below with reference to the accompanying drawings.

Figure 1:
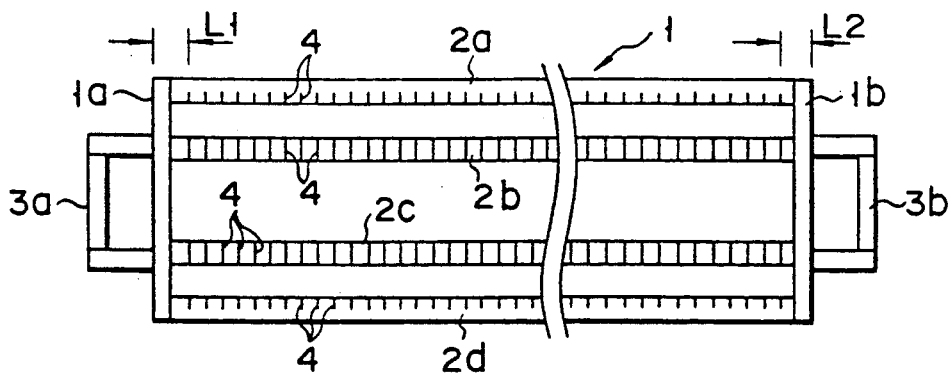
FIG. 1 is a plan view of a conventional boat.
Figure 2:
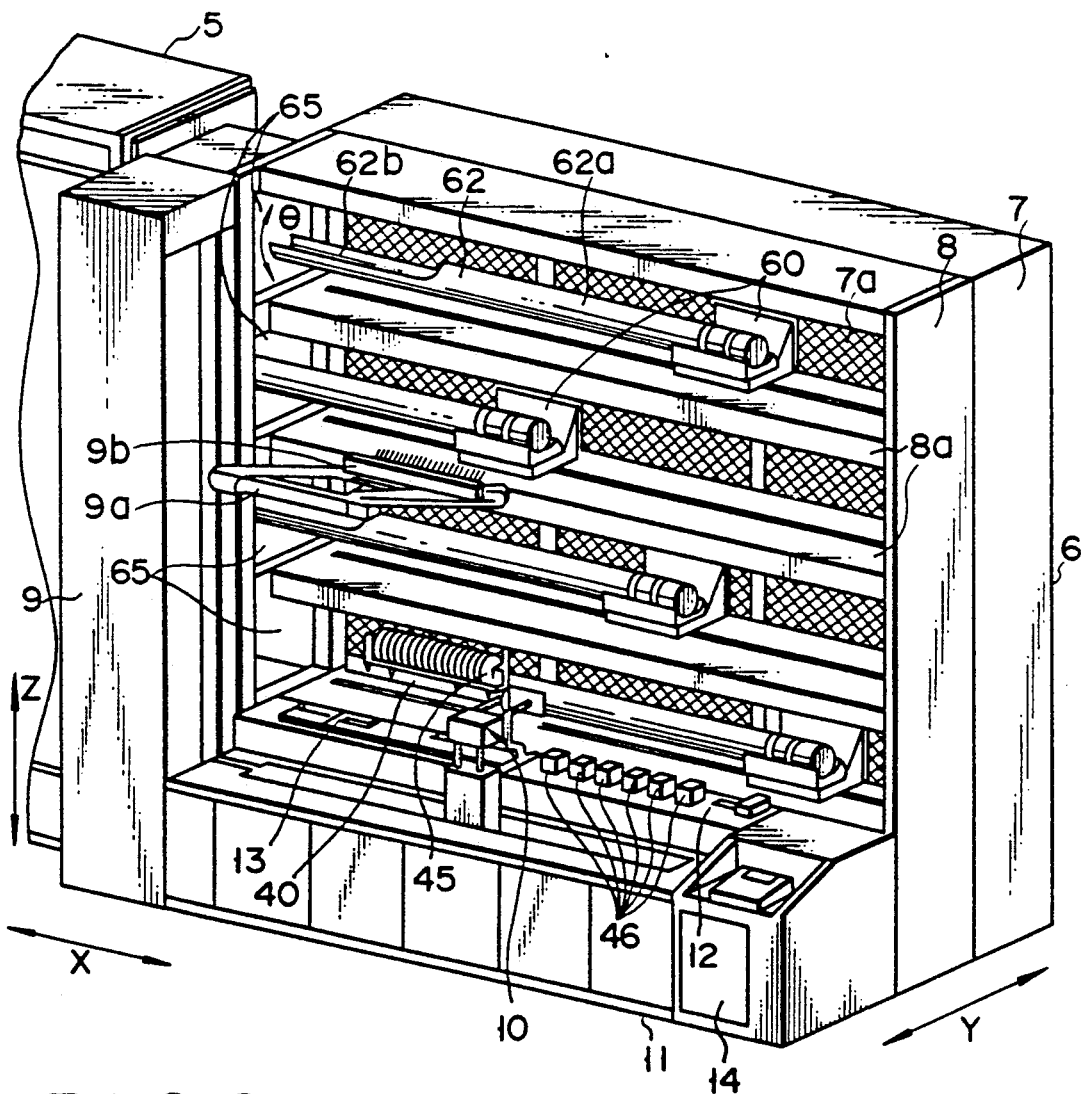
FIG. 2 is a perspective view illustrating the installation around an inlet of a furnace.

As shown in FIG. 2, a heating furnace 5 is of a multi-stage type which has four single furnaces put one on another in four stages, and a plurality of process tubes (not shown) are inserted in series, in a laid state, in each furnace. This heating furnace 5 is used for oxidation and diffusion treatments of silicon wafers.

A multi-shelf unit 6 for accommodating boats is disposed in such a way as to communicate with a furnace inlet 65 of heating furnace 5. The multi-shelf unit 6 includes a filter unit 7 having an air filter 7a and a unit 8 for carrying a boat 40 stacked with a number of wafers 45 in, and out from, the furnace 5 through furnace inlet 65. Unit 8 has four shelves 8a each communicating with inlet 65 at its one end. Each shelf 8a is provided with a soft landing device 60 having a quartz-glass fork 62.

Soft landing device 60 has a mechanism slidable in the X-axis direction along the length of the associated shelf 8a and a mechanism that can lift fork 62 up and down in the Z-axis direction as well as can swing it in the $\theta$-axis direction. Fork 62 has a cylindrical section 62a and a fork-end boat support section 62b provided at the distal end of the section 62a. Boat 40 is adapted to be disposed on support section 62b.

An elevator device 9 is provided on the front side and between heating furnace 5 and unit 6. Elevator device 9 has an arm 9a and a member 9b provided at the distal end of arm 9a to transfer boat 40 on the boat stage to support section 62b of fork 62. Elevator device 9 further has a mechanism for moving member 9b in the X- and Z-axis directions.

A box type housing 11 is provided in front of unit 8 along the first stage shelf 8a. On housing 11, a first stage 12 and a second stage 13 are provided. A plurality of cassettes 46 are disposed in a line on first stage 12, and a single boat 40 is disposed on second stage 13.

A loading device 10 for loading wafers 45 from each cassette 46 onto boat 40 is provided in front of housing 11, and this loading device 10 has a computer-controlled panel 14 through which data is keyed in.

Figure 3:
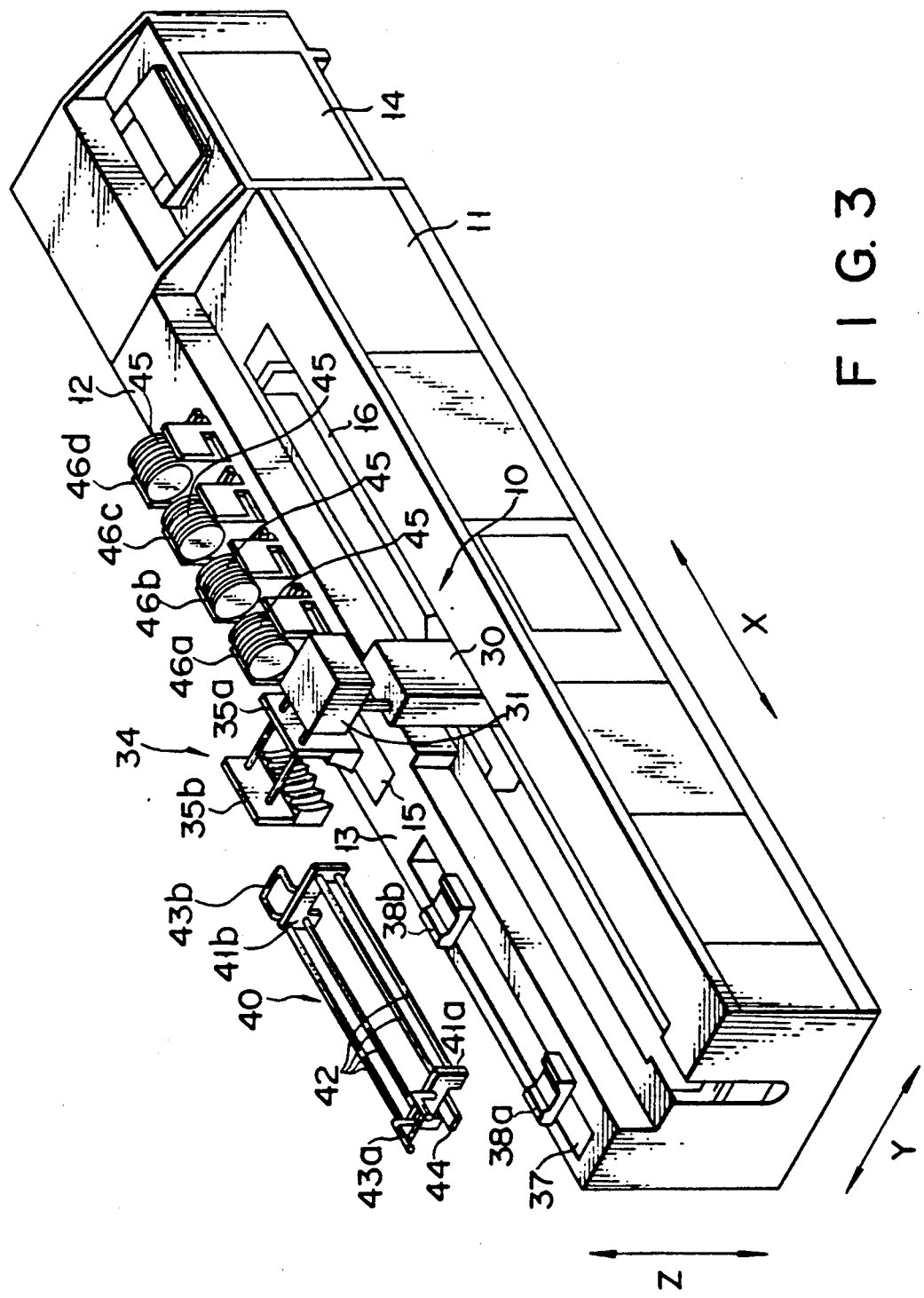
FIG. 3 is a perspective view illustrating a wafer transferring apparatus according to the first embodiment of this invention.

As shown in FIG. 3, first and second stages 12 and 13 lie on the same line and on the same elevation, and respectively have openings 15 and 37 formed therein.

Cassettes 46a to 46d are disposed so as to lie over the first opening 15. Each cassette has grooves formed in its inner wall at given intervals therebetween, with wafer 45 being vertically retained in each groove. A pushing member 28 (see FIG. 4), which will be described later, is adapted to come up from first opening 15.

A pair of receiving members 38a and 38b of quartz-glass is provided slidable in the X-axis direction in second opening 37, and these members 38a and 38b support boat 40.

A third opening 16 is formed near the front of housing 11 in parallel to first and second openings 15 and 37. A cylinder 30 and chuck mechanism 31 as upper mechanisms of loading device 10 are protruding through this third opening 16.

Figure 4:
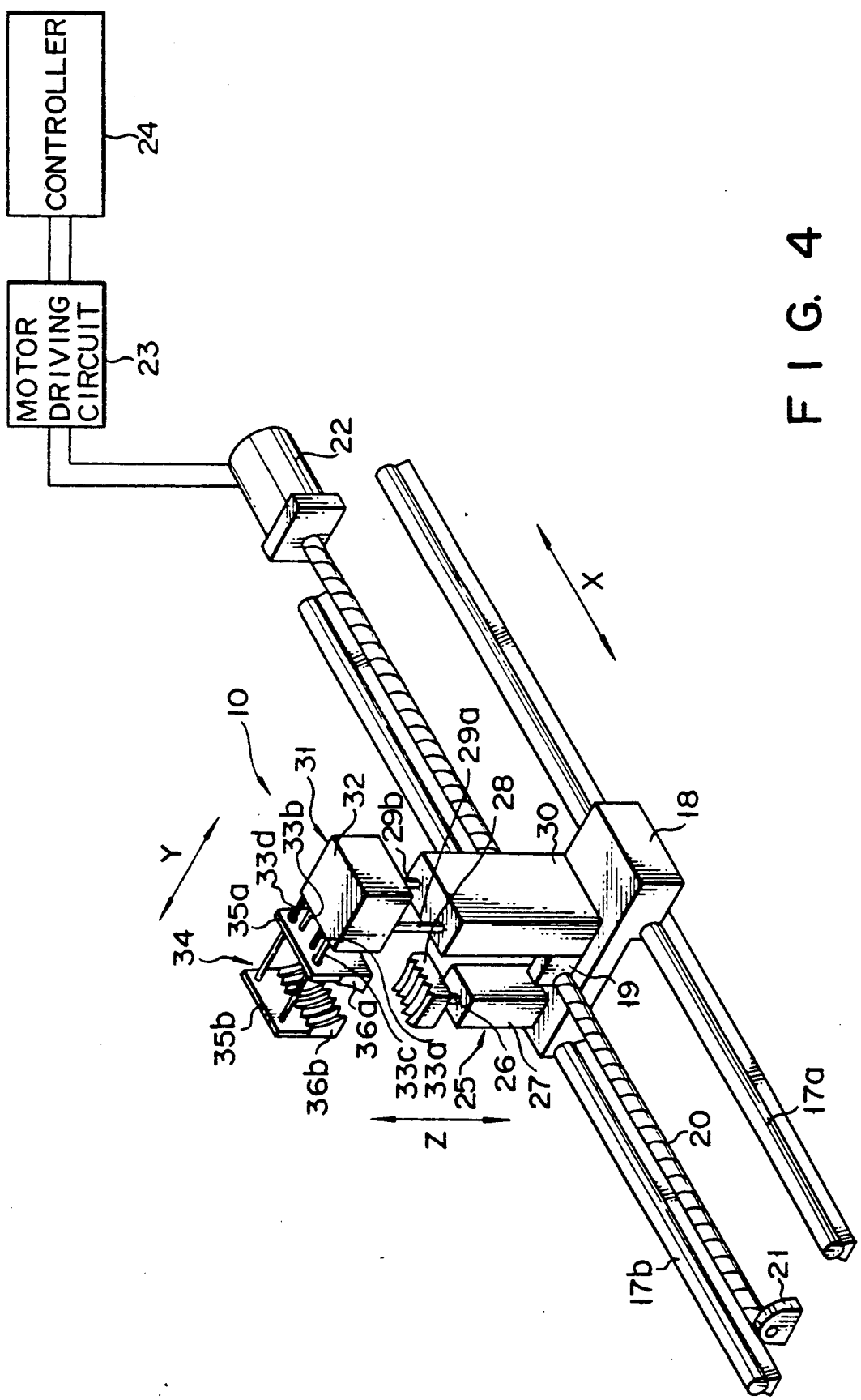
FIG. 4 is a perspective view of a loading device.

Referring now to FIG. 4, a description will be given of the individual elements and individual driving mechanisms of loading device 10.

Loading device 10 has a pushing mechanism 25, a chuck mechanism 31, and an X-axis moving mechanism. The lower portion of loading device 10 constitutes the X-axis moving mechanism and has two parallel guide shafts 17a and 17b along the X-axis and a ball screw 20. A slide table 18 is provided to lie over guide shafts 17a and 17b and supports the upper portion of loading device 10. Ball screw 20 is engaged with a nut on slide table 18, and has its one end coupled to the drive shaft of a pulse motor 22 and the other end fixed to housing 11 by means of a member 21.

A switch for motor 22 is coupled to a motor driver 23, which is coupled to a controller 24. The controller 24 is controlled by a computer system (not shown). That is, when a given signal is sent to driver 23 from the computer system through controller 24, pulse motor 22 is driven accordingly and table 18 slides in the X-axis direction.

A description will now be given of the upper structure of loading device 10.

As described earlier, the upper portion of loading 10 comprises pushing mechanism 25 having a Z-axis moving mechanism and chuck mechanism 31 having Y- and Z-axis moving mechanisms.

First and second air cylinders 27 and 30 are provided on table 18 so as to have their shafts normal to the table 18. First cylinder 27 has a rod 26 whose upper end is coupled to a plate member 28 that has grooves formed on its upper surface at the same pitch as the grooves formed in the inner wall of cassette 46. This plate member 28 is adapted to come up through first opening 15 by the action of cylinder 27.

A main body 32 of chuck mechanism 31 is coupled to rods 29a and 29b of cylinder 30 and is shiftable up and down in the Z-axis direction. Four rods 33a too 33d horizontally extend from main body 32, the first two rods 33a and 33b being coupled to a switching member 35a of a chuck 34 and the remaining rods 33c and 33d being coupled to another switching member 35b of chuck 34. Main body 32 is a gear box having a motor (not shown), and a gear for driving rods 33a and 33b is driven in the opposite direction to the driving direction of a gear for driving rods 33c and 33d. In order to prevent mutual interference of rods 33a to 33d in operation, rods 33c and 33d penetrate switching member 35a.

Switching members 35a and 35b of chuck 34 respectively include holding sections 36a and 36b having pawls at their opposing or facing faces. The grooves formed between the pawls of holding sections 36a and 36b have the same pitch as the inner grooves of cassette 46.

The individual operations of cylinders 27 and 30 and chuck mechanism main body 32 are controlled in accordance with signals given from the computer system based on a predetermined programming.

Figure 5:
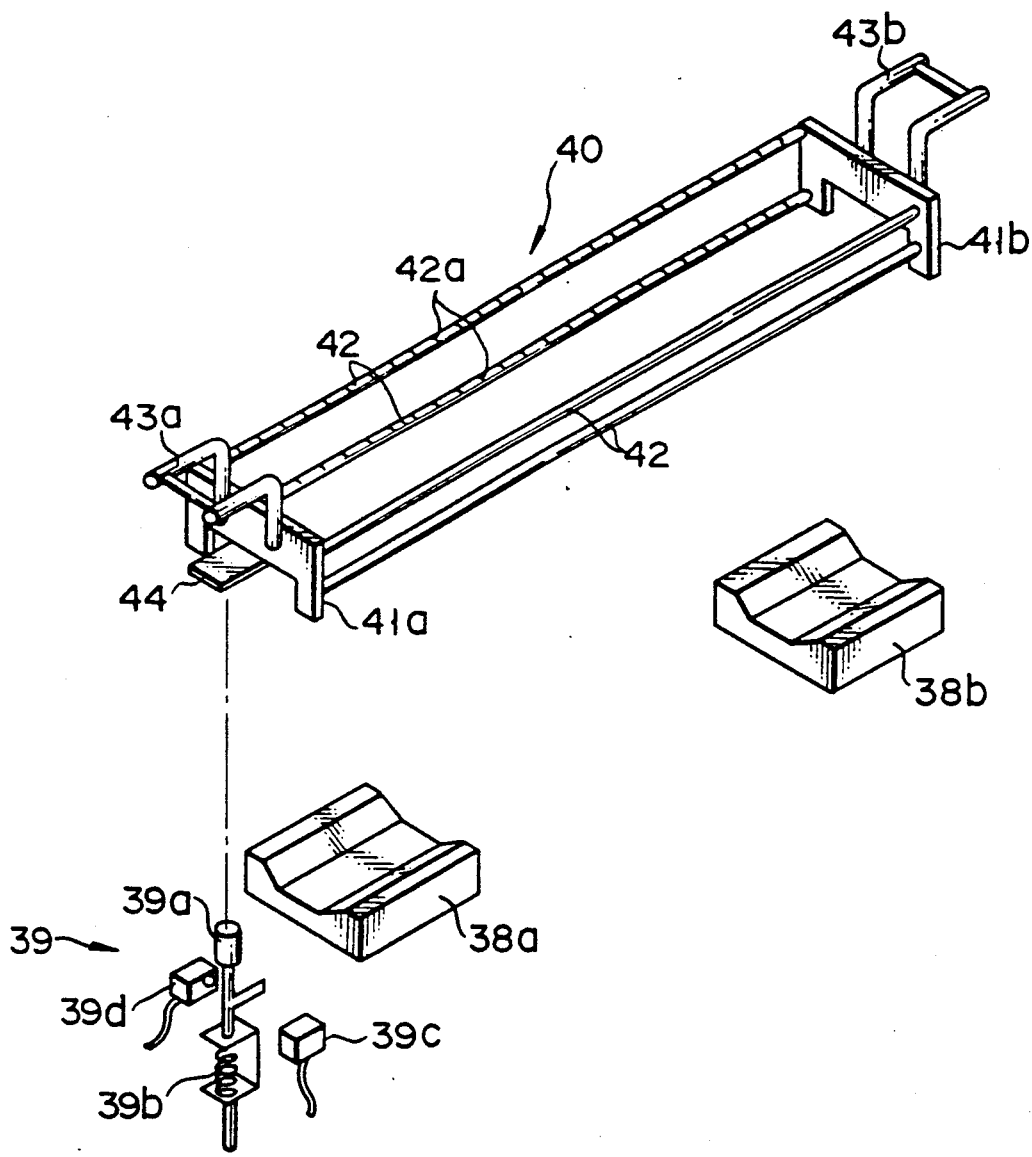
FIG. 5 is a perspective view illustrating an exemplary mutual positional relationship between a boat and a sensor in the wafer transferring apparatus according to the first embodiment.

Referring now to FIG. 5, a description will be given of the boat and wrong disposition detection means.

Boat 40 comprises a pair of end plates 41a and 41b, four rods 42 supported in parallel by the end plates, a pair of handles 43a and 43b for manual conveyance, and a plate piece 44 attached only to one of the end plates, 41a. Every part of boat 40 is made of quartz-glass; however, boat 40 may be made of SiC.

In second opening 37 of boat stage 13 is provided a wrong boat disposition detector 39 in addition to a pair of receiving members 38a and 38b. This detector 39 includes a contact member 39a urged by a spring 39b and a pair of sensors 39c and 39d for detecting the contact of member 39a with plate piece 44. These sensors 39c and 39d are coupled to an input section of the computer system.

Detector 39 is coupled to an alarm device (not shown) in order to easily detect the wrong disposition of boat 40.

Figure 6:
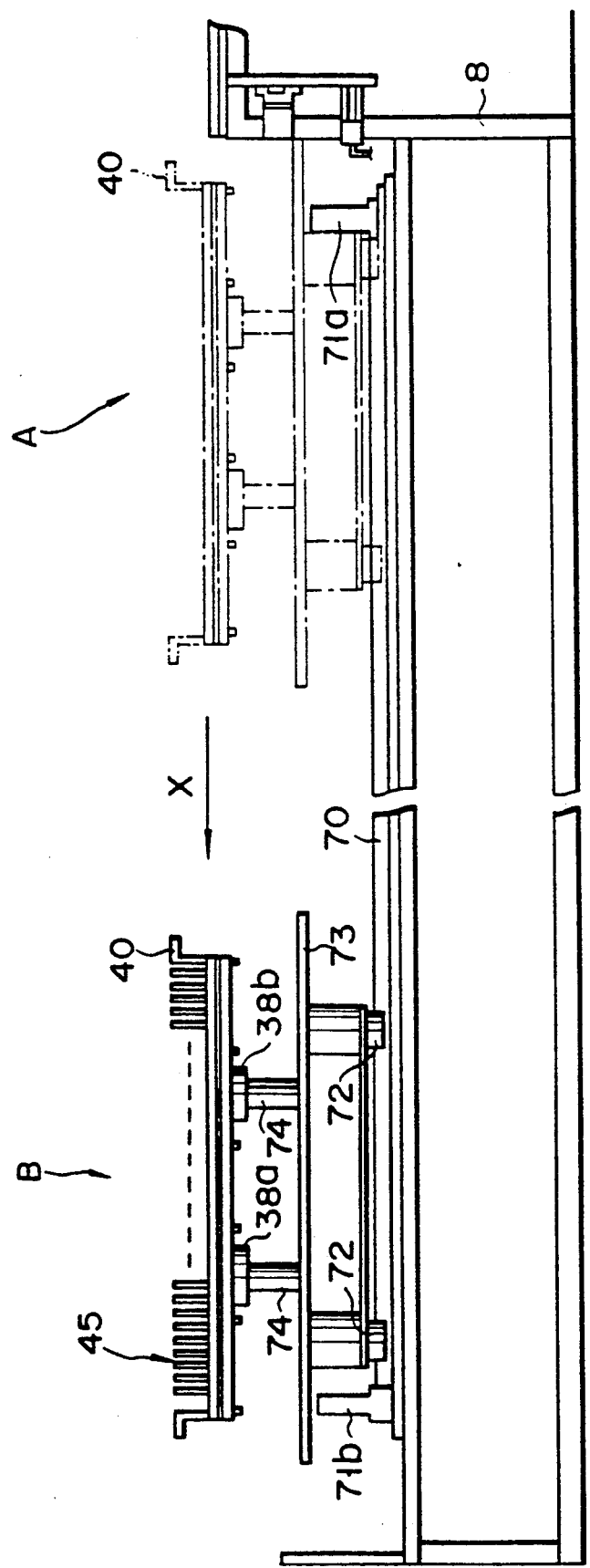
FIG. 6 is a front view of a boat conveying device.

Referring now to FIG. 6, a boat conveying device will be described.

The boat conveying device comprises a rail 70 fixed to the frame of unit 8 along the X-axis, a pair of stoppers 71a and 71b provided at the respective ends of rail 70, a linear guide 72 provided slidable on rail 70, means (not shown) for sliding linear guide 72, a board 73 disposed on guide 72, and a pair of receiving members 38a and 38b supported by members 74 provided on board 73. The means for sliding linear guide 72 along rail 70 has a motor (not shown) which is controllable by the computer system, and by which boat 40 is carried from a wafer transferring position A to a boat delivering position B. In other words, wafers 45 in a carrier are sequentially loaded on boat 40 at the position A by means of loading device 10, and this boat 40 carrying wafers 45 is delivered to fork 62 of soft landing device 60 at the position B by means of elevator device 9.

Boat receiving members 38a and 38b and fork 62 are made of quartz-glass in order to prevent the generation of powder due to mutual contact to thereby maintain a high clean state in the room.

Referring now to FIGS. 2 to 10, particularly, to FIGS. 7 to 10, a description will be given of how to sequentially transfer wafers 45 from cassettes 46a to 46d onto boat 40 by means of loading device 10.

(I) Four cassettes 46a to 46d each carrying 25 silicon wafers 45 are arranged at given positions on the first stage 12 in such a way that the openings of cassettes 46a–46d are vertically continuous with first opening 15.

(II) The specific distance $L_1$ to boat 40 (the distance between the outer edge of end plate 41a and the first adjoining groove 42a) is measured and the measured data is input to the computer. Boat 40 is disposed at a given position on second stage 13. If boat 40 is set the right side front, plate piece of the boat pushes down member 39a, so that the member 39a disappears from the front of sensor 39c. As a result, the computer system discriminates that boat 40 is set properly.

If boat 40 is set the wrong side front on stage 13, however, boat 40 is detected by sensor 39d of detector 39. At the same time, since member 39a still exists in front of sensor 39c, an alarm is generated to permit an operator to know the wrong disposition of boat 40.

(III) According to the affirmative decision as to the boat disposition, the computer system sends a command signal to controller 24 and driver 23, and pulse motor 22 is rotated for a given period of time based on this signal. This shifts table 18 of loading device 10 by a predetermined distance in the X-axis direction so that the first carrier 46a comes directly above pushing mechanism 25. Then, the computer system sends a predetermined operation command signal to chuck mechanism 31 to retract rods 33a and 33b in main body 32 and protrude rods 33c and 33d from the main body 32, thereby opening switching members 35a and 35b (see FIG. 7).

(IV) Then, the computer system sends a predetermined operation command signal to pushing mechanism 25 to supply a given amount of compressed air to cylinder 27, thereby protruding member 28 upward through first opening 15. As a result, member 28 pushes wafers 45 together from cassette 46a. The pushing or urging operation is stopped so as to stop wafers 45 between a pair of holding members 36a and 36b of the chuck mechanism.

(V) After the pushing operation is stopped, a predetermined operation command signal is sent to chuck mechanism 31 to protrude rods 33a and 33b from main body 32 while retracting rods 33c and 33d within main body 32. Consequently, switching members 35a and 35b are closed and wafers 45 are held together by holding members 36a and 36b (see FIG. 8).

(VI) Then, a given amount of compressed air is supplied to cylinder 30 of chuck mechanism 31 to protrude rod 29a to lift up main body 32. This transports wafers 45 to chuck mechanism 31 from pushing mechanism 25.

(VII) While being held by chuck 34, wafers 45 are lifted up in the Z-axis direction, moved horizontally in the X-axis direction, and lowered in the Z-axis direction in the name order, as shown in FIG. 9. In other words, wafers 45 are conveyed from the first stage 12 to the second stage 13 so as to be close to left end plates 41a of boat 40.

(VIII) As shown in FIG. 10, when edge portions of the individual wafers 45 are inserted in the respective grooves 42a of boat 40, the down movement of chuck 34 is stopped and switching members 35a and 35b are opened to transfer all of wafers 45 onto boat 40 from chuck mechanism 31.

(IX) With switching members 35a and 35b being opened, chuck 34 is moved from second stage 13 to first stage 12 in such a way as to come directly over second carrier or cassette 46b. Then, member 28 of pushing mechanism 25 is pushed to lift up all of wafers 45 from second cassette 46b and the wafers 45 are then grabbed by chuck 34. Thereafter, the same operation as done for first cassette 46a is repeated to transfer wafers 45 to the next position (immediately adjacent to the first wafer lot). In this manner, wafers 45 of first to fourth cassettes 46a to 46d are sequentially loaded on boat 40.

(X) Upon completion of wafer transfer, boat 40 now carrying wafers 45 is transported to delivery position B from transfer position A (see FIG. 6). Then, while being held by member 9b of elevator device 9, boat 40 is conveyed from stage 13 to the furnace to be used and is moved to holding section 62b of fork 62. Then, fork 62 is inserted in the process tube in the furnace, and only boat 40 is left within the furnace by soft landing device 60. Thereafter, boat 40 is subjected to heat treatment at a given temperature for a given period of time.

According to the first embodiment, if boat 40 is set the wrong side front, an alarm would be generated so that the operator hearing it can correct the position of boat 40. This can ensure the correct alignment of boat 40 with respect to wafers 45 in each cassette to thereby prevent a mismatch between the wafers 45 and grooves 42a formed in the boat. Accordingly, it is possible to effectively avoid an undesirable accident such as damaging a wafer during the auto transporting operation, thus improving the yield of wafers.

Referring now to FIG. 11, the second embodiment will be described. With regard to corresponding portions between the first and second embodiments, their descriptions will be omitted.

Boat 40 according to the second embodiment has, a pair of quartz-glass quadratic prisms 47 attached to only one of the handles, 43b, to be asymmetric with respect to its length. A photosensor 54 is provided near boat stage 13 so as to face prisms 47. This photosensor 54 has a light emitting section and light receiving section and detects reflection light, and is coupled at its output side to an alarm device (not shown).

If boat 40 is set properly, the light emitted from sensor 54 is reflected at prism 47 and the reflection light is subjected to photoelectric conversion in the light receiving section. The resultant electric signal is sent to the input section of a computer system. Based on the input data, the computer system discriminates that boat 40 is set properly and sends a command signal for the next operation to loading device 10. If the boat is set the wrong side front on stage 13, however, an alarm is generated from the alarm device.

According to the second embodiment, prisms 47 are mounted to handle 43b, so that the operator can easily identify them to prevent the wrong disposition of the boat.

Referring now to FIG. 12, the third embodiment will be described. With regard to corresponding portions between the third and first embodiments, their descriptions will be omitted to avoid redundancy.

According to the boat of the third embodiment, three rod members 48a to 48c are bridged over wafer supporting rods 42 at predetermined sections thereof. The second rod member 48b is mounted away from the center of the length of boat 40 to make the boat asymmetrical with respect to its length. Directly below second rod member 48b lies a detector 55. When boat 40 is disposed on stage 13, a member 55a urged by a spring 55b is pressed downward by second rod member 48b, thus pressing the lever of a switch 55c downward.

When boat 40 is properly disposed on stage 13, member 55a is pressed downward by second rod member 48b and the lever of switch 55c is also pressed downward by member 55a. As a result, an electric signal is sent to the input section of the computer system. Based on this signal, the computer system discriminates that boat 40 is properly disposed on stage 13, and then sends a command signal for the next operation to loading device 10. Based on the received command signal, loading device 10 sequentially transports wafers 45 from cassettes 46a to 46d onto boat 40.

According to the third embodiment, the operator can easily identify the disposed direction of boat 40, and boat 40 is reinforced by first and second rod members 48a and 48b. A combination of the second and third embodiments can make the asymmetry of the boat clearer to prevent the wrong disposition of the boat more effectively.

Referring now to FIG. 13, the fourth embodiment will be described. With regard to corresponding portions between the fourth and first embodiments, their descriptions will be omitted to avoid redundancy.

According to boat 40 of the fourth embodiment, three pairs of leg members (49a, 49b), (50a, 50b) and (51a, 51b) are attached to supporting rod 42, with the second leg member pair 50a and 50b being disposed at a position to make boat 40 asymmetric with respect to its length. A wrong deposition detector 56 is disposed on stage 13 with its member 56a protruding through opening 37 at a given position. This member 56a is coupled to a switch 56c through a leaf spring 56b.

When this boat 40 is properly disposed on receiving members 38a and 38b on stage 13, leg member 50a pushes member 56a downward to turn switch 56c ON, so that wafers 45 in each cassette are automatically loaded onto boat 40 by loading device 10.

As plural pairs of leg members are mounted to the boat according to the fourth embodiment, the safety or reliability of the boat is improved.

Figure 14:
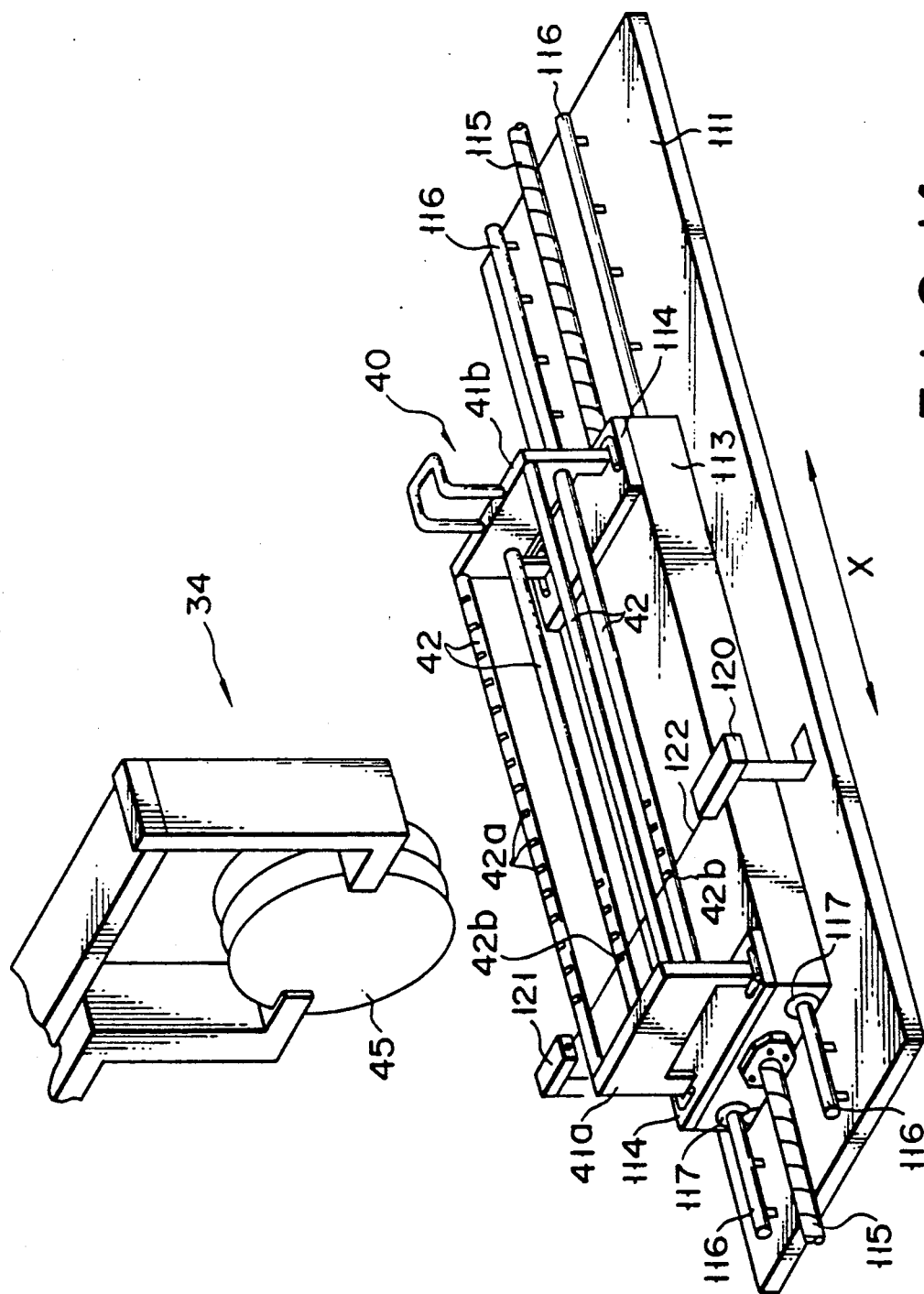
FIG. 14 is a perspective view illustrating part of an apparatus used in a wafer transferring method according to the fifth embodiment.

Referring now to FIGS. 14 to 16, the fifth embodiment will be described. With regard to corresponding portions between the fifth and first embodiments, their descriptions will be omitted to avoid redundancy.

A pair of parallel guide shafts 116 are securely mounted on a base plate 111, and a ball screw 115 is provided in parallel to guide shafts 116. One end of ball screw 115 is coupled to a motor (not shown) which is controlled by the computer system. All of ball screw 115 and guide shafts 116 penetrate stage 13, and linear motion bearings 117 are provided at coupling sections between stage 113 and guide shafts 116. On stage 113 is provided a pair of pedestals 114 through which boat 40 is securely disposed on stage 113 to prevent its deviation.

According to boat 40 of the fifth embodiment, lower two of wafer supporting rods 42 have monitoring grooves 42 formed for alignment of wafers. These monitoring grooves 42b are different from wafer holding grooves 42a and are formed closer to one of the end plates, 41a, of boat 40. Monitoring grooves 42b may take various cross sections, such as a circular cross section and a rectangular section.

Sensors 120 and 121, which are fixed on base plate 111 so as to sandwich boat 40 on stage 113, are coupled to the input section of the computer system. Based on a command signal from the computer system, sensor 120 emits light of a predetermined wavelength toward sensor 121.

A description will now be given of how to transfer wafers 45 onto the above boat 40.

Boat 40 is disposed on stage 113, ball screw 115 is rotated to move boat 40 together with stage 113 in the X-axis direction and at the same time monitoring grooves 42b are detected by sensors 120 and 121. In this case, light 122 emitted from sensor 120 passes two grooves 42b and enters the light receiving section of sensor 121. This incident light is converted into an electric signal there, which is in turn sent to the input section of the computer system. The computer system then acquires the distance between boat 40 and the first cassette 46a with the position of grooves 42b as reference point.

Further, a wafer stage (not shown) is moved in the X-axis direction in such a way that the acquired distance becomes equal to the moving distance of loading device 10 in the X-axis direction which is preset by a programming, hereby compensating the position of cassette 46a with respect to boat 40. Then, all of wafers 45 in cassette 46a are grabbed by chuck 34 and loaded on boat 40 with the side of grooves 42b as the reference position.

Although non-contact type sensors are used to detect monitoring grooves 42b for wafer alignment according to the fifth embodiment, the sensors are not restricted to this particular type. These sensors may be replaced with contact type sensors having a specially-shaped piece fittable to monitoring grooves 42b.

Such contact type sensors have an advantage over the non-contact type in that they can detect monitoring grooves 42b and compensate the position of the boat at the same time.

Referring now to FIG. 15, a description will be given of a partial modification of the fifth embodiment.

In this modification, six monitoring grooves $42c_1$ to $42c_6$ are formed in boat supporting rods 42 at intervals each being wide enough for a single cassette. That is, 25 wafers can be accommodated in each of regions a to f of grooves $42c_1$ to $42c_6$.

With the use of the modified boat 40, first, wafers 45 are transferred from the first cassette 46a on region a of the boat with groove $42c_1$ as a reference. then wafers 45 of the second cassette 46b are transferred onto region b with groove $42c_2$ as a reference. In this manner, wafers 45 are sequentially transferred from cassettes 46a–46f onto six regions a–f of the boat while sequentially changing reference grooves $42c_1$–$42c_6$.

According to the above modification, when boat 40 is deformed through repeated heat treatments as shown in FIG. 6, the mismatch between grooves 42a and wafers 45 will not be accumulated so that the wafers can be safely transferred to the boat from the cassettes.

Figure 17:
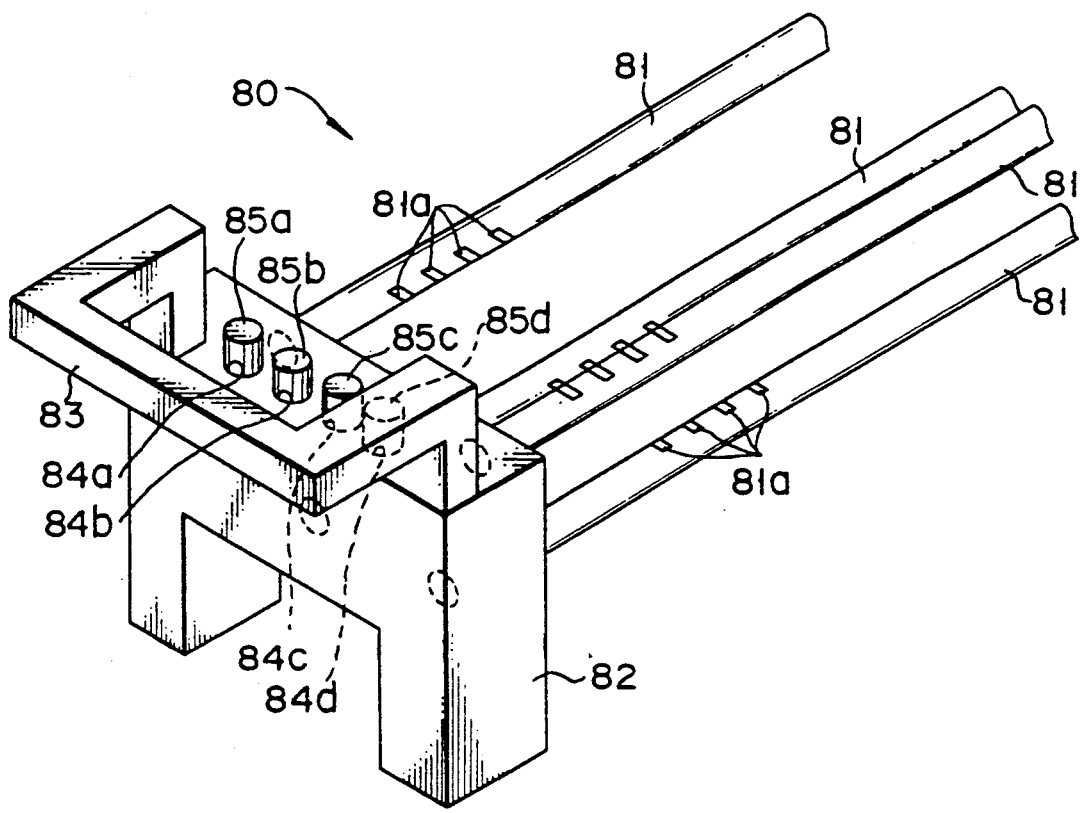
FIG. 17 is a perspective view illustrating part of a boat according to the sixth embodiment.
Figure 18:
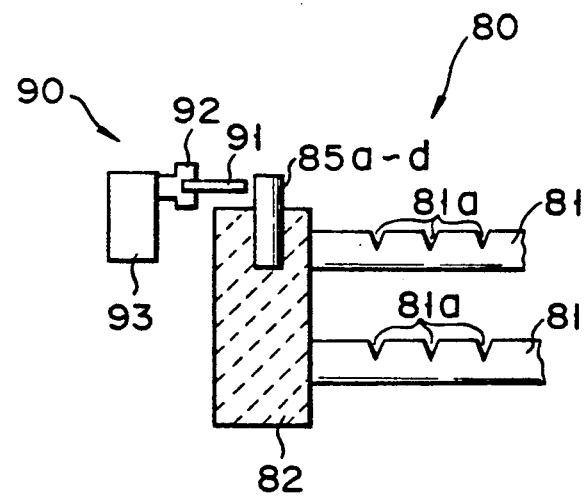
FIG. 18 is a front view illustrating part of the boat according to the sixth embodiment and an identifying sensor.

Referring now to FIGS. 17 to 19, the sixth embodiment will be described. With regard to corresponding portions between the sixth and first embodiments, their descriptions will be omitted to avoid redundancy.

As shown in FIG. 17, boat 80 according to the sixth embodiment has four holes 84a to 84d formed in the top surface of one of end plates 82. Pins 85a to 85d serving as identification codes are adapted to be respectively fitted into these four holes 84a–84d. These pins 85a–85d are made of quartz-glass. In this case, it is desirable that the quartz-glass for these pins be colored red, blue, etc.

As shown in FIG. 18, a sensor 90 is disposed in front of boat 40 and it comprises a detection pin 91, a holder 92 and ON/OFF switch 93.

As shown in FIG. 19, sensor 90 is coupled to a CPU 100 of a computer system. CPU 100 has a controller 101 for controlling the driving system for the boat conveying device and a memory 102 for storing detection data.

A description will now be given of how to load wafers on the above boat 80 and how to insert boat 80 into a furnace of a predetermined stage of a four-stage furnace.

A plurality of empty boats 80 are prepared and are separated for each expected one of the first to fourth stage furnaces. Data specific to each boat 80 is stored in advance in memory 102. The specific data corresponds to the actually measured distance $L_1$ between the outer edge of one end plate 82 and the first adjacent groove 81a. For instance, the specific length data $L_1$ may be 11 mm for the first boat, 10.5 mm for the second boat, and so forth.

Pins 85a–85d are fitted into holes 84a–84d of each boat 80 according to a given rule. In this case, theoretically, $2^4$ types of identification codes can be formed by changing the combination of holes 84a–84d and pins 85a–85d.

Boat 80 is disposed on the boat stage and pin 91 of sensor 90 is rendered to abut on pins 85a–85d. Where pins 85a–85d exist, switch 93 is ON and its signal is sent to CPU 100.

CPU 100 discriminates the quantity and positions of pins 85a–85d based on the signal from sensor 90. Given that "1" indicates the existence of a pin and "0" indicates the otherwise, for example, a signal (1, 1, 1, 1) indicates that there exist four pins 85a–85d.

The specific length data $L_1$ is read out from memory 102 and is sent to CPU 100, and based on this data, wafers 45 are sequentially transferred on boat 80 from cassettes 46a–46d.

Upon completion of the wafer transfer, CPU 100 finds out a target furnace for boat 80 based on the boat identification data and specific data.

Then, controller 101 sends a command signal to the boat conveying device and elevator device 9 (see FIG. 2). As a result, boat 80 is conveyed to elevator device 9 which in turn moves the boat 80 to the shelf 8a of the target furnace.

This embodiment is not restricted to the above particular structure. For instance, patterns having different light reflection factors may be formed on the surface of end plates 82 of different boats, and reflection light from each pattern may be detected by its associated photosensor to be used as an identification code. In this case, it is desirable that the reflection surface be processed to have strain finish to vary the reflection factor, thereby providing a pattern specific to each boat.

According to the above embodiment, since boats can be individually identified, even with the, quantity of boats in actual use being increase, it is possible to prevent each boat from being erroneously inserted into the wrong furnace.

The following summarizes the effects of this invention.

According to this invention, it is possible to prevent a boat from being disposed the wrong side front on its associated boat stage. Further, the mutual position between a cassette and boat can be compensated every time wafers are transferred onto the boat from each cassette. Accordingly, a mismatch between wafers and grooves formed in a boat can be eliminated at the time wafers are transferred onto the boat, thus preventing the wafers from being damaged.

In addition, it is possible to prevent quartz-glass powder from being generated by the mismatched wafers scraping the walls of the grooves, thus maintaining the working room clean. Accordingly, the production line can be prevented from being unnecessarily stopped.

All of the above effects result in improvement of the yield of wafers.

Further, according to this invention, boats which are difficult to visually identify with the prior art can be individually identified. Therefore, each boat can be surely inserted into its target furnace, so that a hard heat treatment schedule can be properly dealt with. Particularly, this invention is effective in the case where many boats should be dealt with in a multistage furnace.

What is claimed is:

1. A wafer transferring apparatus comprising:
   loading means for extracting a wafer from a cassette on which said wafer is disposed and transferring said wafer onto a boat;
   means for arranging said boat in a predetermined wafer transferring position;
   an identification section asymmetrically formed in the boat in a longitudinal direction of the boat;
   means for detecting said identification section in the wafer transferring position; and
   means for judging whether the boat is correctly disposed on the wafer transferring position based on the result of detection of said identification section;
   wherein said boat is arranged again or replaced by the boat arranging means in the case where the boat is judged not to be disposed correctly or judged to be a different boat.

2. The wafer transferring apparatus according to claim 1, wherein said detecting means comprises a member to be pushed down by said identification section of said boat when said boat is disposed on a stage means, said member being electrically coupled to said judging means.

3. The wafer transferring apparatus according to claim 2, comprising a further stage means on which said cassette is disposed, said further stage means and said stage means on which said boat is arranged being aligned in a line in a lengthwise direction of said boat.

4. The wafer transferring apparatus according to claim 1, wherein said loading means has a pushing mechanism for pushing said wafers above said cassette, a chuck mechanism for holding and releasing pushed wafers and an X-axis drive mechanism for moving said chuck mechanism in a lengthwise direction of said boat.

5. The wafer transferring apparatus according to claim 1, wherein said judging means is a computer system having a keyboard for manually entering various pieces of data of said boat.

6. A wafer transferring apparatus according to claim 1, wherein said identification section is a reinforcing member bridged between rod members for holding the wafer.

7. A wafer transferring apparatus for transferring wafers from a cassette onto a boat comprising:
   loading means for extracting a wafer from the cassette and transferring said wafer onto the boat;
   means for arranging said boat in a predetermined wafer transferring position for receiving said wafer which is extracted from said cassette by said loading means;
   identifying means asymmetrically formed in a longitudinal direction of said boat, wherein said identifying means is formed on said boat in a position which identifies that said boat is in said predetermined wafer transferring position;
   means for detecting said identifying means on said boat when the boat is positioned in said wafer transferring position and supplying a signal indicative thereof; and
   judging means for receiving said signal from said detecting means and determining whether the boat is positioned in said wafer transferring position, such that when said judging means determines that the boat is not in said wafer transferring position, said boat is arranged again or replaced by said boat arranging means.

* * * * *